United States Patent
Riess et al.

(10) Patent No.: US 8,341,485 B2
(45) Date of Patent: Dec. 25, 2012

(54) INCREASING HYBRID AUTOMATIC REPEAT REQUEST (HARQ) THROUGHPUT

(75) Inventors: Eilon Riess, Zichron Yaakov (IL); Amir Rubin, Ramat Gan (IL); Timor Israeli, Kfar Shmuel (IL)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 12/881,836

(22) Filed: Sep. 14, 2010

(65) Prior Publication Data

US 2012/0066562 A1    Mar. 15, 2012

(51) Int. Cl.
*H04L 1/18* (2006.01)
*H03M 13/00* (2006.01)

(52) U.S. Cl. ....................................................... 714/751

(58) Field of Classification Search ........... 714/748–751
See application file for complete search history.

(56) References Cited

U.S. PATENT DOCUMENTS

| | | | |
|---|---|---|---|
| 7,185,257 B2* | 2/2007 | Kim et al. ....................... | 714/751 |
| 2008/0244352 A1 | 10/2008 | Kwon et al. | |
| 2009/0059801 A1 | 3/2009 | Garrett et al. | |
| 2009/0168708 A1 | 7/2009 | Kumar et al. | |
| 2010/0050041 A1* | 2/2010 | Chang et al. ................... | 714/750 |
| 2011/0041023 A1* | 2/2011 | Shimezawa et al. ........... | 714/748 |
| 2011/0066912 A1 | 3/2011 | Riess et al. | |

OTHER PUBLICATIONS

International Search Report mailed Feb. 29, 2012 from International Application No. PCT/US2011/049509.
Part 11: "Wireless LAN Medium Access Control (MAC) and Physical Layer (PHY) Specifications," IEEE Standard for Information technology—Telecommunications and information exchange between systems—Local and metropolitan area networks—Specific requirements, Jun. 12, 2007, 1232 pages, IEEE Std 802.11-2007, IEEE, New York, NY.
Part 15.1: "Wireless medium access control (MAC) and physical layer (PHY) specifications for wireless personal area networks (WPANs)," IEEE Standard for Information technology—Telecommunications and information exchange between systems—Local and metropolitan area networks—Specific requirements, Jun. 14, 2005, 598 pages, IEEE Std 802.15.1-2005, IEEE, New York, NY.
Part 16: "Air Interface for Fixed Broadband Wireless Access Systems," IEEE Standard for Local and metropolitan area networks, Oct. 1, 2004, 893 pages, IEEE Std 802.16-2004, IEEE, New York, NY.
IEEE Computer Society, Part 11: Wireless LAN Medium Access Control (MAC) and Physical Layer (PHY) Specifications, IEEE Standard for Information technology—Telecommunications and information exchange between systems—Local and metropolitan area networks—Specific requirements, Jun. 12, 2007, 1232 pages, IEEE Std 802.11-2007, IEEE, New York, NY.

(Continued)

*Primary Examiner* — Shelly A Chase
(74) *Attorney, Agent, or Firm* — Schwabe, Williamson & Wyatt, P.C.

(57) ABSTRACT

In some embodiments, the invention involves increasing hybrid automatic repeat request (HARQ) throughput. In one embodiment, throughput may be increased by clearing the retransmission buffer at least one frame in advance, based on status received from the downlink device before a full acknowledgement. Another embodiment partitions HARQ bursts into two groups. A first group is for packet data units (PDUs) that are anticipated to be in error and a second group is for PDUs anticipated to be received correctly. Only PDUs that are anticipated to be in error, based on forward error correction (FEC) blocks, are to be saved in the retransmission buffer. Other embodiments are described and claimed.

16 Claims, 4 Drawing Sheets

OTHER PUBLICATIONS

IEEE Computer Society, Part 15.1: Wireless medium access control (MAC) and physical layer (PHY) specifications for wireless personal area networks (WPANs), IEEE Standard for Information technology—Telecommunications and information exchange between systems—Local and metropolitan area networks—Specific requirements, Jun. 14, 2005, 598 pages, IEEE Std 802.15.1-2005, IEEE, New York, NY.

IEEE Computer Society, Part 16: Air Interface for Fixed Broadband Wireless Access Systems, IEEE Standard for Local and metropolitan area networks, Oct. 1, 2004, 894 pages, IEEE Std 802.16-2004, IEEE, New York, NY.

Riess et al., U.S. Appl. No. 12/561,126 entitled "Method and System to Increase the Throughput of a Hybrid Automatic Repeat Request (HARQ) Protocol", filed on Sep. 16, 2009, 34 pages.

* cited by examiner (Prior Art)
FIG. 1A (Prior Art)
FIG. 1B

INCREASING HYBRID AUTOMATIC REPEAT REQUEST (HARQ) THROUGHPUT

CROSS-REFERENCE TO RELATED APPLICATION

This application is related to U.S. patent application Ser. No. 12/561,126, entitled "Method And System To Increase The Throughput of A Hybrid Automatic Repeat Request (HARQ) Protocol," filed on 16 Sep. 2009 by Eilon Riess, et al., assigned to a common assignee, the entire subject matter which is herein incorporated by reference.

FIELD OF THE INVENTION

An embodiment of the present invention relates generally to wireless uplink and downlink communications and, more specifically, to methods for increasing throughput in hybrid automatic repeat request message overhead used in a wireless network.

BACKGROUND INFORMATION

In a wireless network, a hybrid automatic repeat request (HARQ) protocol is used to ensure high reliability and high data transmission efficiency of the wireless network. The HARQ protocol combines a forward error correction (FEC) scheme and an automatic repeat request (ARQ) scheme.

Figure 1A:
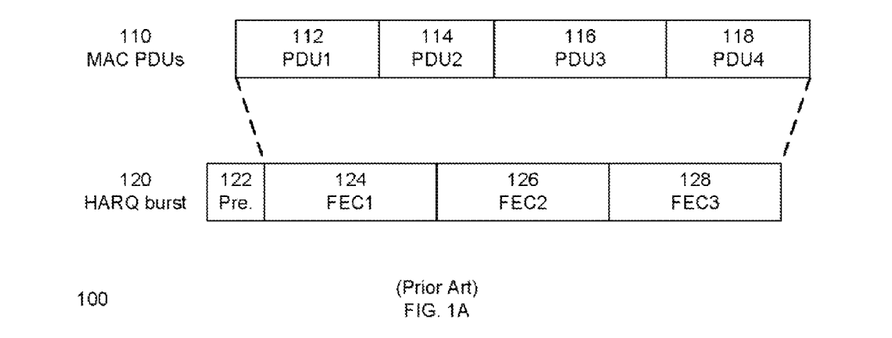
FIG. 1A illustrates a block diagram of a prior art HARQ burst.

FIG. 1A illustrates a block diagram 100 of a prior art HARQ burst 120. When data is to be sent from a sending station to a receiving station in a wireless network, the data is sent in the form of medium access control (MAC) packet data units (PDUs), or sub-packets 110. The MAC layer of the sending station concatenates the PDUs 112, 114, 116, and 118 and the physical (PHY) layer of the sending station adds a preamble 122 to the concatenated PDUs 112, 114, 116, and 118 to form a HARQ burst 120 for transmission. The PDUs 112, 114, 116, and 118 are divided or partitioned into the FEC blocks 124, 126, and 128 by the PHY layer of the sending station.

Figure 1B:
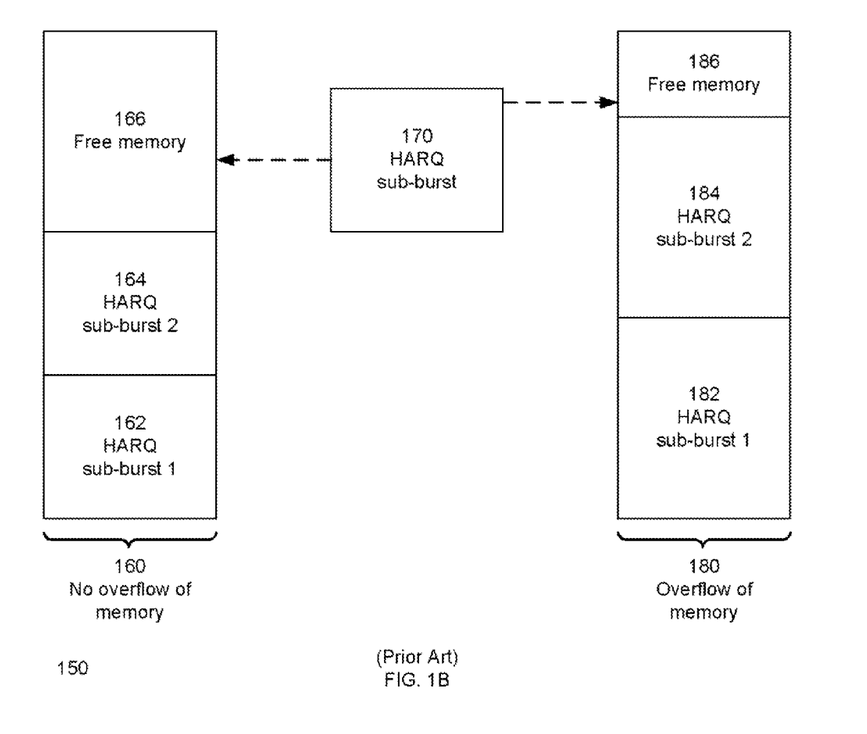
FIG. 1B illustrates two scenarios of the memory state of a buffer in a prior art station.

The downlink (DL) throughput of the HARQ protocol used in a station may be limited to a maximum limit to guarantee that the throughput of the HARQ protocol does not exceed the buffering capabilities of the station. FIG. 1B illustrates two scenarios 150 of the memory state of a buffer in a prior art station. The first scenario, where there is no overflow of memory 160, occurs when the buffer in the station has sufficient free memory space 166 to store a HARQ sub-burst 170 that fails a cyclic redundancy check. The HARQ sub-burst 170 may be a retransmission of the same burst that has been stored in the station as the HARQ sub-bursts 162 and 164.

To increase the throughput of the HARQ protocol used in a station, the size of each HARQ sub-burst can be increased. However, increasing the size of each HARQ sub-burst has a drawback because the station may experience more memory overflows in its buffer. This is illustrated in the second scenario, where there is an overflow of memory 180, that occurs when the buffer in the station has insufficient free memory space 186 to store the HARQ sub-burst 170 that fails a cyclic redundancy check. The station therefore aborts storing the HARQ sub-burst 170 and clears the HARQ sub-burst 170.

The current HARQ protocol implementation does not allow the throughput of the HARQ protocol to be increased or to decrease the number of occurrences of memory overflow events in a wireless network.

When transmitting an HARQ burst, the burst needs to be stored until an indication that it has been received correctly from the receiver arrives at the transmitter. In the case that the burst was not received correctly, the transmitter retransmits the stored HARQ burst. As such the longer the burst needs to be stored, usually referred to as round trip time (RTT) the lower the overall throughput can be reached.

BRIEF DESCRIPTION OF THE DRAWINGS

The features and advantages of the present invention will become apparent from the following detailed description of the present invention in which.

DETAILED DESCRIPTION

An embodiment of the present invention is a system and method relating to increasing throughput of HARQ bursts by storing only the PDUs that are known to have errors. Another embodiment of the present invention shorten the RTT by managing the HARQ buffers to take advantage of the UL MAPs and by a buffer clearing prioritization method based on known versus un-known reception status of transmitted HARQ bursts.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

For purposes of explanation, specific configurations and details are set forth in order to provide a thorough understanding of the present invention. However, it will be apparent to one of ordinary skill in the art that embodiments of the present invention may be practiced without the specific details presented herein. Furthermore, well-known features may be omitted or simplified in order not to obscure the present invention. Various examples may be given throughout this description. These are merely descriptions of specific embodiments of the invention. The scope of the invention is not limited to the examples given.

In an HARQ operation, in the case a CRC failure indicates that the decoded HARQ burst is not received correctly. The HARQ burst's soft metrics are stored, i.e. for each of the received bits several LLRs (log likely-hood ratio) bits are stored. The LLR of each bit is typically represented by several bits (6 to 8 bits). Thus a stored HARQ burst of size L bits will typically occupy L×6 to L×8 bits of memory.

An HARQ burst fails if one or more of its bits have been received incorrectly.

The received HARQ bursts may be partitioned and stored into two groups:

Group 1: Group of bits that are known to not contain the error received bits

Group 2: All the rest of the bits

The bits of Group 1 are then stored, discarding the LLR representation. However, the LLR of the bits for Group 2 are stored. But avoiding having to save all of the LLR bits from Group 1, the requirements on the HARQ memory are reduced from:

Occupied memory=$Y \times LLR\_Res$, to

Occupied memory=Size(Group 1)+($Y$-Size(Group 1))$\times LLR\_Res$, where Y is the size of the HARQ burst and LLR_Res is the number of bits by which the LLR is represented.

In one particular case, where the HARQ burst is compactly constructed by higher layer PDUs, where each PDU has its own CRC, then Group 1 may be determined by identifying FEC blocks that carry only bits from PDUs that pass the CRC check. All other FEC blocks would belong to Group 2.

In existing systems, standards with commercially deployed networks typically only have indication if the HARQ burst as a whole fails. Thus, if necessary, the entire HARQ burst needs to be stored along with the LLR expansion. Some standards, still under development, are adding CRC per FEC block.

Embodiments of the invention which partition received bits by failure/no failure, and store only the failed portion, do not involve any intervention of the transmitter or any change of standard, but allows currently deployed standards using existing hardware yield much higher HARQ throughput.

Figure 2:
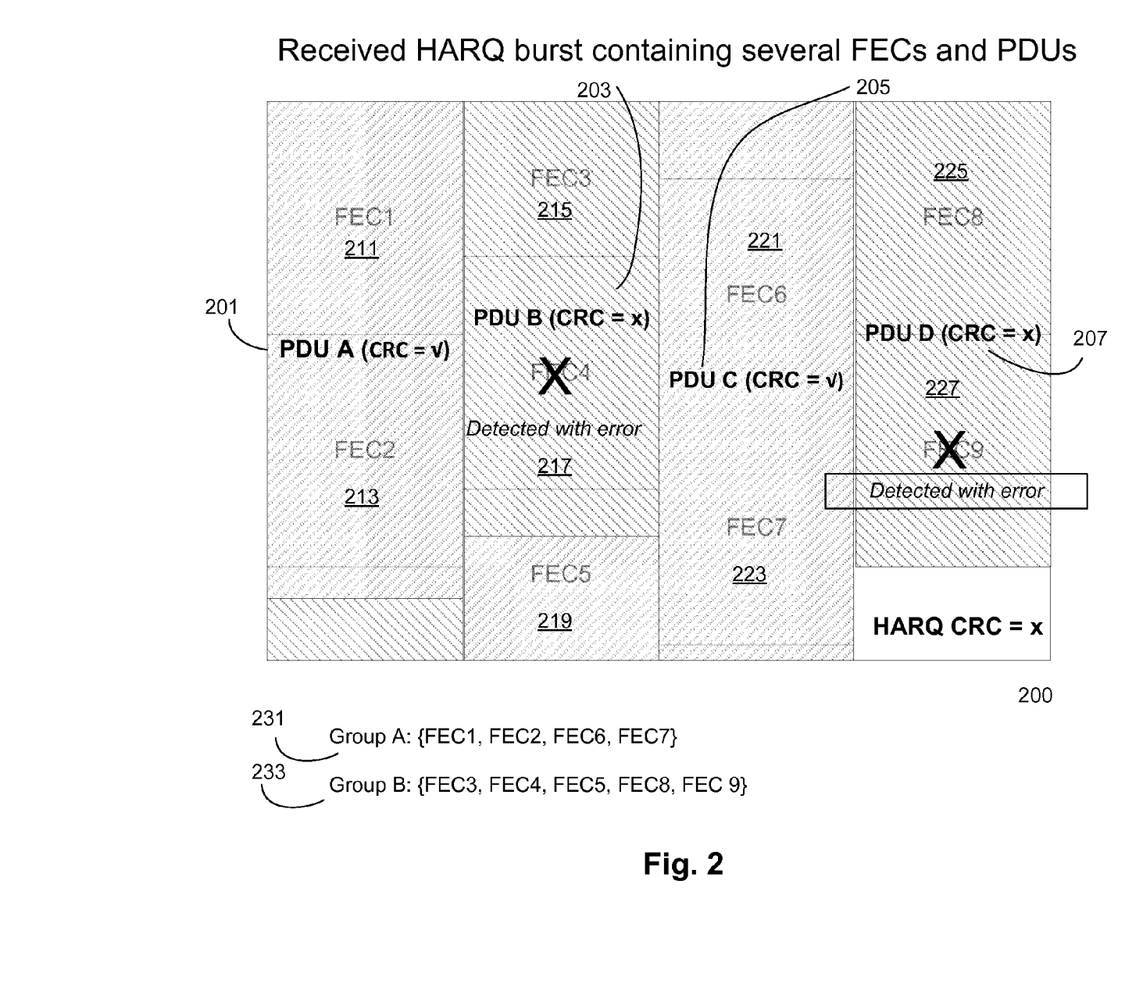
FIG. 2 is a block diagram illustrating the partitioned PDUs and FECs, according to an embodiment of the invention.

FIG. 2 is a block diagram illustrating the partitioned PDUs and FECs, according to an embodiment of the invention. A HARQ burst 200 is sent with packet data units (PDUs) A, B, C and D (201, 203, 205, and 207, respectively). The PDUs comprise a number of forward error correction (FEC) blocks 1-9 (211, 213, 215, 217, 219, 221, 223, 225 and 227, respectively). In this illustration, the CRC for PDUs A (201) and C (205) pass, so these bits are not in error. The CRC indicates that FEC blocks 4 (217) and 9 (227) have been detected with errors. Thus, the FEC blocks FEC4 (217) and FEC9 (227) must be saved for retransmission.

In an embodiment, the FEC blocks are partitioned into groups A (231) and B (233). Group A comprises the FEC blocks within the PDUs that have passed the CRC. In this example, Group A comprises FEC blocks 1, 2, 6 and 7. Group B comprises the FEC blocks within the PDUs that have failed the CRC, e.g., FEC blocks 3, 4, 5, 8 and 9. Only the PDUs in Group B must be saved for retransmission, instead of the entire HARQ burst. Assuming, for example, that the LLR_RES is 8 bits, the amount of memory saved is 1−(8×5+ 4)/(8×9)=1−44/72. In this example, the memory saved is about 39%.

In another embodiment, the HARQ throughput may be increased by shortening the time that the HARQ burst is stored. This time may be referred to as the round trip time (RTT). When transmitting an HARQ burst, if the burst is not correctly received, the burst needs to be stored at the transmitter until the transmitter receives an indication that the burst has been correctly received by the receiver. The transmitter must retransmit the stored HARQ burst until it has been properly received and acknowledged. As such, the longer the burst needs to be stored (RTT) the lower the overall throughput, because fewer bursts may be stored in the limited memory space.

Shortening the actual time an HARQ burst is stored from RTT to RTT-1 may be achieved by relying on the property that the uplink (UL) command (UL mobile application parts, or MAPs, in the case of 802.16 Standard, or WiMax) is known one frame before the actual UL transmission. In such a case, the UL throughput may be increased by RTT/RTT-1. For example, when RTT=5 then the HARQ throughput may be increased by 5/4=1.25. This throughput increase may be performed by HARQ buffer management, pushing up the HARQ throughput (as an example by declaring higher transmit HARQ throughput capability). In the case of memory overflow, the buffer management will store new HARQ bursts at the expense of clearing already stored HARQ bursts. This clearing is not done arbitrarily, but according to a prioritizing method based on known versus un-known reception status of transmitted HARQ bursts.

When an HARQ burst does not to need retransmission, this status may be devised from the UL MAP for WiMax and known one frame before the actual UL allocation. Existing systems have failed to take advantage of this knowledge. If the transmission has succeeded, the HARQ burst may be cleared from the HARQ memory one frame in advance of when it is cleared in existing systems. If more memory space is required for the new HARQ bursts for that frame then other stored HARQ bursts would be cleared. After clearing bursts that are known to be successful, bursts having an unknown retransmission requirement at a frame may be cleared. When an HARQ burst is known to need retransmission, then it would be kept in the HARQ memory and other bursts, at that stage/frame, have unknown retransmission needs will be cleared from the HARQ buffer, making space for the new HARQ burst.

If an HARQ burst that has been cleared needs retransmission at a later frame, the mobile station (MS) sends physical zeros at the related allocation. The faulty package is then treated by an outer-loop correction, if one exists. (e.g. ARQ, or transmission control protocol (TCP) loops).

Figure 3:
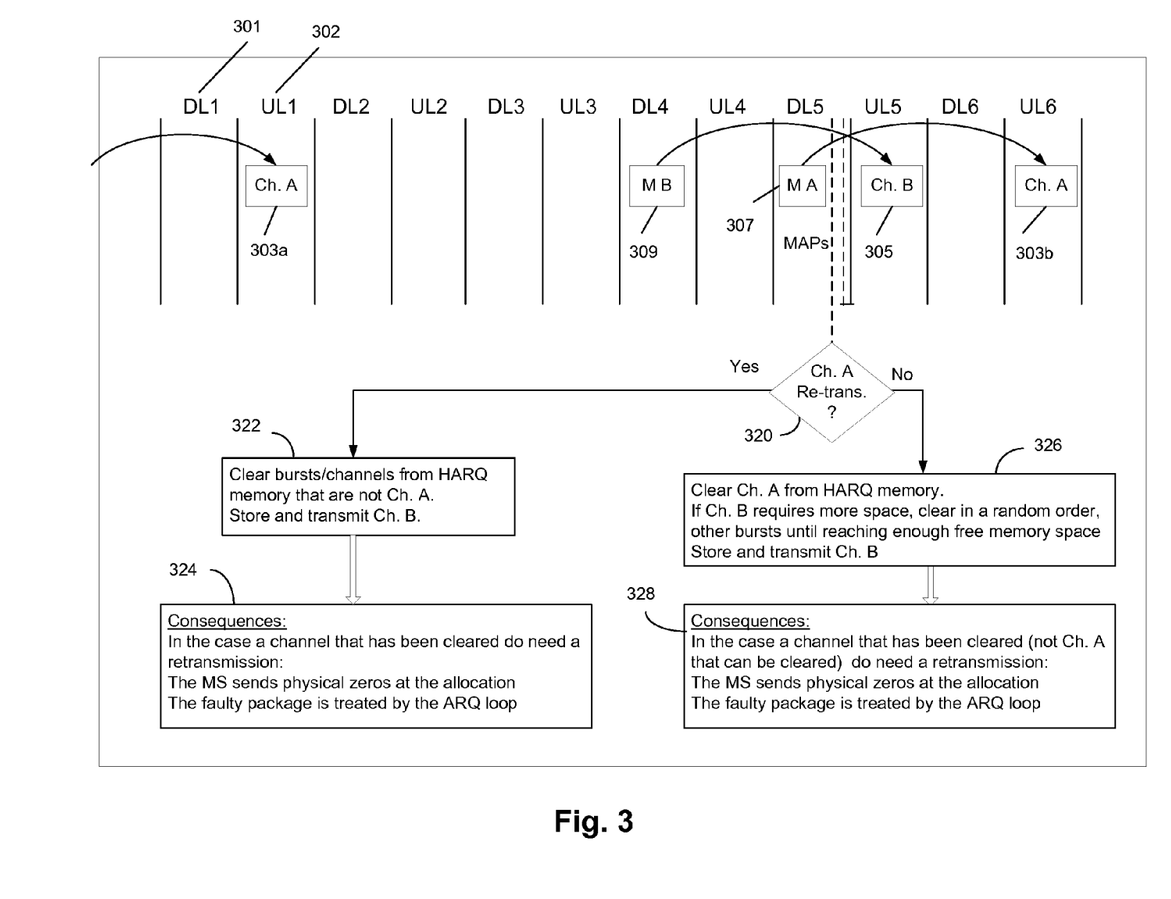
FIG. 3 is an illustration of an HARQ flow in a WiMax system, according to an embodiment of the invention.

FIG. 3 is an illustration of an HARQ flow in a WiMax system, according to an embodiment of the invention. DL1 301 and UL1 302, for instance, are downlink (DL) and uplink (UL) subframe of frame 1, respectively. Ch. A 303a-b and Ch. B 305 are carrying HARQ burst A and HARQ burst B, respectively. M A 307 and M B 309 contain the indications of the reception status of HARQ burst A and B, respectively.

In this example, the UL MAP (M A 307) for HARQ burst A is sent at DL frame 5 (DL5). This frame may indicate whether HARQ burst A was received correctly at the receiver. A determination is made at block 320 as to whether a retransmission of HARQ burst A will be required. If so, the bursts/channels from bursts other than Ch. A are cleared from HARQ memory, in priority order, as discussed above, in block 322. The next frame shows the reception of Ch. B. Ch. B is stored and transmitted.

When a channel that has been cleared needs a retransmission, the MS sends physical zeros at the allocation, in block 324. The faulty package is treated by the ARQ loop, or other error correction protocol.

When it has been determined by the UL map that Ch. A does not need retransmission, in block 320, Ch. A may be cleared from HARQ memory, in block 326. If Ch. B requires more space for storage, then other bursts are cleared in a random order until reaching enough free memory space to store the Ch. B burst. Ch. B is then stored and transmitted.

When a channel that has been cleared needs a retransmission, the MS sends physical zeros at the allocation, in block 328. The faulty package is treated by the ARQ loop, or other error correction protocol. The probability that a burst cleared from memory needs retransmission may be one time every few tens of seconds.

Figure 4:
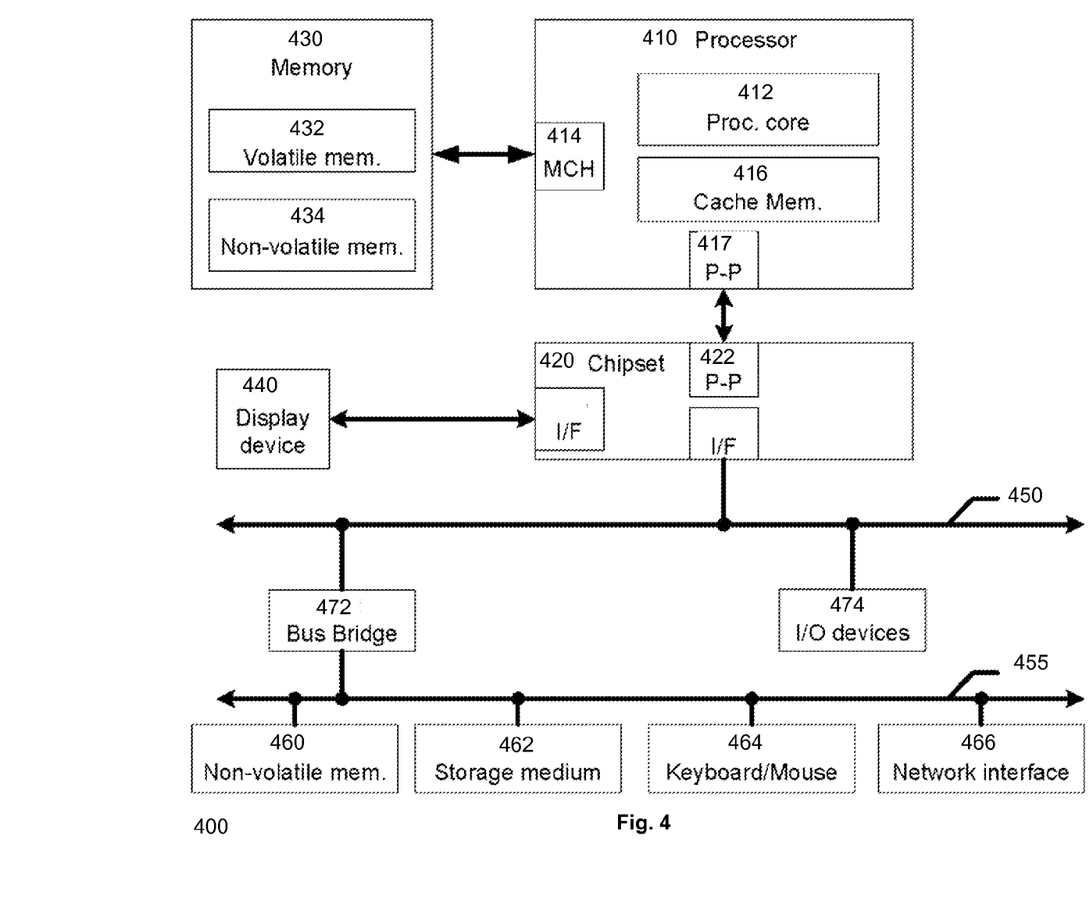
FIG. 4 illustrates a computing system to implement the methods disclosed herein, in accordance with an embodiment of the invention.

FIG. 4 illustrates a system 400 to implement the methods disclosed herein in accordance with one embodiment of the invention. The system 400 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 400 used to implement the methods disclosed herein may be a system on a chip (SOC) system.

The processor 410 has a processing core 412 to execute instructions of the system 400. The processing core 412 may include, but is not limited to, pre-fetch logic to fetch instructions, decode logic to decode the instructions, execution logic to execute instructions and the like. The processor 410 may have a cache memory 416 to cache instructions and/or data of the system 400. In another embodiment of the invention, the cache memory 416 includes, but is not limited to, level one, level two and level three, cache memory or any other configuration of the cache memory within the processor 410.

A memory control hub (MCH) 414 ma perform functions that enable the processor 410 to access and communicate with a memory 430 that includes a volatile memory 432 and/or a non-volatile memory 434. The volatile memory 432 may include, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 may include, but is not limited to, NAND flash memory, phase change memory (PCM), read only memory (ROM), electrically erasable programmable read only memory (EEPROM), or any other type of non-volatile memory device.

The memory 430 stores information and instructions to be executed by the processor 410. The memory 430 may also stores temporary variables or other intermediate information while the processor 410 is executing instructions. The chipset 420 may connect with the processor 410 via Point-to-Point (PtP) interfaces 417 and 422. The chipset 420 enables the processor 410 to connect to other modules in the system 400. In one embodiment of the invention, the interfaces 417 and 422 operate in accordance with a PtP communication protocol such as the Intel® QuickPath Interconnect (QPI) or the like. The chipset 420 may connect to a display device 440 that may include, but is not limited to, liquid crystal display (LCD), cathode ray tube (CRT) display, or any other form of visual display device.

In addition, the chipset 420 connects to one or more buses 450 and 455 that interconnect the various modules 474, 460, 462, 464, and 466. Buses 450 and 455 may be interconnected together via a bus bridge 472 if there is a mismatch in bus speed or communication protocol. The chipset 420 couples with, but is not limited to, a non-volatile memory 460, a mass storage device(s) 462, a keyboard/mouse 464 and a network interface 466. The mass storage device 462 includes, but is not limited to, a solid state drive, a hard disk drive, an universal serial bus flash memory drive, or any other form of computer data storage medium. The network interface 466 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface (not shown) operates in accordance with, but is not limited to, the IEEE 802.11 standard and its related family, Home Plug AV (HPAV), Ultra Wide Band (UWB), Bluetooth, WiMax (IEEE 802.16), or any form of wireless communication protocol. In an embodiment, the HARQ module including wireless interface and buffer, may reside on the chipset 420.

While the modules shown in FIG. 4 are depicted as separate blocks within the system 400, the functions performed by some of these blocks may be integrated within a single semiconductor circuit or may be implemented using two or more separate integrated circuits. For example, although the cache memory 416 is depicted as a separate block within the processor 410, the cache memory 416 may be incorporated into the processor core 412 respectively. The system 400 may include more than one processor/processing core in another embodiment of the invention.

The techniques described herein are not limited to any particular hardware or software configuration; they may find applicability in any computing, consumer electronics, or processing environment. The techniques may be implemented in hardware, software, or a combination of the two.

For simulations, program code may represent hardware using a hardware description language or another functional description language which essentially provides a model of how designed hardware is expected to perform. Program code may be assembly or machine language, or data that may be compiled and/or interpreted. Furthermore, it is common in the art to speak of software, in one form or another as taking an action or causing a result. Such expressions are merely a shorthand way of stating execution of program code by a processing system which causes a processor to perform an action or produce a result.

Each program may be implemented in a high level procedural or object-oriented programming language to communicate with a processing system. However, programs may be implemented in assembly or machine language, if desired. In any case, the language may be compiled or interpreted.

Program instructions may be used to cause a general-purpose or special-purpose processing system that is programmed with the instructions to perform the operations described herein. Alternatively, the operations may be performed by specific hardware components that contain hardwired logic for performing the operations, or by any combination of programmed computer components and custom hardware components. The methods described herein may be provided as a computer program product that may include a machine accessible medium having stored thereon instructions that may be used to program a processing system or other electronic device to perform the methods.

Program code, or instructions, may be stored in, for example, volatile and/or non-volatile memory, such as storage devices and/or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any mechanism for storing, transmitting, or receiving information in a form readable by a machine, and the medium may include a tangible medium through which electrical, optical, acoustical or other form of propagated signals or carrier wave encoding the program code may pass, such as antennas, optical fibers, communications interfaces, etc. Program code may be transmitted in the form of packets, serial data, parallel data, propagated signals, etc., and may be used in a compressed or encrypted format.

Program code may be implemented in programs executing on programmable machines such as mobile or stationary computers, personal digital assistants, set top boxes, cellular telephones and pagers, consumer electronics devices (including DVD players, personal video recorders, personal video players, satellite receivers, stereo receivers, cable TV receivers), and other electronic devices, each including a processor, volatile and/or non-volatile memory readable by the processor, at least one input device and/or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments where tasks or portions thereof may be performed by remote processing devices that are linked through a communications network.

Although operations may be described as a sequential process, some of the operations may in fact be performed in parallel, concurrently, and/or in a distributed environment, and with program code stored locally and/or remotely for access by single or multi-processor machines. In addition, in some embodiments the order of operations may be rearranged without departing from the spirit of the disclosed subject matter. Program code may be used by or in conjunction with embedded controllers.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A computer implemented method in a wireless transmitting device, comprising:
    anticipating whether a hybrid automatic repeat request (HARQ) sub-packet having one or more forward error correction (FEC) blocks is expected to be received correctly by a receiving device;
    grouping the sub-packet into one of two groups, the groups comprising a first group for sub-packets with a detected error and a second group for sub-packets with no detected error; and
    storing for retransmission, only those sub-packets falling into the first group, in anticipation of retransmission.

2. The method of claim 1, wherein anticipating whether an HARQ sub-packet is to be received correctly, further comprises:
    determining whether each FEC block within the sub-packet contains an error based on results of a cyclic redundancy check (CRC) of each FEC block; and
    when no error is detected in any FEC block in the sub-packet, indicating that the sub-packet is expected to be received correctly; and
    when an error is detected in any FEC block in the sub-packet, indicating that the sub-packet is expected to be received incorrectly.

3. The method of claim 1, wherein the HARQ sub-packet is compliant at least in part with one of an Institute of Electrical and Electronics Engineers (IEEE) 802.11 family of standards, an IEEE 802.15 family of standards, an IEEE 802.16 family of standards, and a third generation partnership project (3GPP) Long Term Evolution (LTE) standard.

4. An apparatus, comprising:
    a retransmission buffer;
    logic to detect errors in a forward error correction (FEC) block; and
    logic coupled with the retransmission buffer to:
        identify a hybrid automatic repeat request (HARQ) sub-packet as having one or more forward error correction (FEC) blocks with either at least one detected error, or no detected errors;
        associate the sub-packet with one of two groups, the groups comprising a first group for sub-packets with a detected error in any FEC block, and a second group for sub-packets with no detected error, and
        store in the retransmission buffer, only those sub-packets falling into the first group.

5. The apparatus as recited in claim 4,
The method of claim 1, wherein identifying whether an HARQ sub-packet has a detected error, further comprises logic to:
    determine whether each FEC block within the sub-packet contains an error based on results of a cyclic redundancy check (CRC) of each FEC block; and
    when no error is detected in any FEC block in the sub-packet, indicate that the sub-packet is expected to be received correctly; and
    when an error is detected in any FEC block in the sub-packet, indicate that the sub-packet is expected to be received incorrectly.

6. The apparatus of claim 4, wherein the HARQ sub-packet is compliant at least in part with one of an Institute of Electrical and Electronics Engineers (IEEE) 802.11 family of standards, an IEEE 802.15 family of standards, an IEEE 802.16 family of standards, and a third generation partnership project (3GPP) Long Term Evolution (LTE) standard.

7. A computer implemented method, comprising:
    sending a hybrid automatic repeat request (HARQ) burst having one or more forward error correction (FEC) blocks to a receiving device, by a transmitting device, the HARQ burst to be sent as a plurality of sub-packets in a plurality of frames;
    receiving by the transmitting device, a sub-packet error status from the receiving device at least one frame in advance of receiving a full receipt acknowledgement from the receiving device of sub-packet receipt; and
    reducing a length of time that the HARQ sub-packet is stored in a retransmission buffer in the transmitting device for possible retransmission to a receiving device, when the sub-packet error status indicates that the sub-packet will be received correctly by the receiving device.

8. The method as recited in claim 7, wherein the sub-packet error status is part of an uplink (UL) mobile application part (MAP) message sent by the receiving device before a full acknowledgement.

9. The method as recited in claim 7, further comprising:
    clearing the buffer of older HARQ bursts to allow space in the buffer for new HARQ bursts.

10. The method as recited in claim 9, wherein clearing the older HARQ bursts from the retransmission buffer further comprises:
    first, clearing HARQ bursts that are known to have been received without error;
    second, clearing HARQ bursts that are anticipated to be received correctly, but have an unknown status; and
    continuing to store HARQ bursts that are known to require retransmission.

11. The method as recited in claim 9, further comprising:
    receiving a message of physical zeros indicating a request for retransmission of a HARQ burst;

determining whether the requested HARQ burst is stored in the buffer;

when the requested HARQ burst is not stored in the buffer, then utilizing an outer-loop correction mechanism to restore the requested HARQ burst; and when the requested HARQ burst is stored in the buffer, then retransmitting the HARQ burst.

12. An apparatus, comprising:

a retransmission buffer;

logic to detect errors in a forward error correction (FEC) block; and logic coupled with the retransmission buffer to:

send a hybrid automatic repeat request (HARQ) burst having one or more forward error correction (FEC) blocks to a receiving device, by a transmitting device, the HARQ burst to be sent as a plurality of sub-packets in a plurality of frames;

receive by the transmitting device, a sub-packet status message from the receiving device at least one frame in advance of receiving a full receipt acknowledgement from the receiving device of sub-packet receipt; and reduce a length of time that the HARQ sub-packet is stored in a retransmission buffer in the transmitting device for possible retransmission to a receiving device, when the sub-packet status message indicates that the sub-packet will be received correctly by the receiving device.

13. The apparatus as recited in claim 12, wherein the sub-packet status message is part of an uplink (UL) mobile application part (MAP) message sent by the receiving device before a full acknowledgement.

14. The apparatus as recited in claim 12, further comprising logic to:

clear the buffer of older HARQ bursts to allow space in the buffer for new HARQ bursts.

15. The apparatus as recited in claim 14, wherein clearing the older HARQ bursts from the retransmission buffer further comprises logic to:

first, clear HARQ bursts that are known to have been received without error;

second, clear HARQ bursts that are anticipated to be received correctly, but have an unknown status; and continue to store HARQ bursts that are known to require retransmission.

16. The apparatus as recited in claim 14, further comprising logic to:

receive a message of physical zeros indicating a request for retransmission of a HARQ burst;

determine whether the requested HARQ burst is stored in the buffer;

when the requested HARQ burst is not stored in the buffer, then utilize an outer-loop correction mechanism to restore the requested HARQ burst; and when the requested HARQ burst is stored in the buffer, then retransmit the HARQ burst.

\* \* \* \* \*